United States Patent
Sengupta (10) Patent No.: US 6,850,877 B1
(45) Date of Patent: Feb. 1, 2005

(54) WORST CASE PERFORMANCE MODELING OF ANALOG CIRCUITS

(75) Inventor: Manidip Sengupta, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 814 days.

(21) Appl. No.: 09/686,002

(22) Filed: Oct. 11, 2000

Related U.S. Application Data (60) Provisional application No. 60/167,837, filed on Nov. 29, 1999.

(51) Int. Cl.$^7$ .............................................. G06F 17/50
(52) U.S. Cl. .............................. 703/14; 703/2; 703/22; 716/4
(58) Field of Search ............................ 703/1–2, 13–22; 716/1–6

(56) References Cited

U.S. PATENT DOCUMENTS

| | | | |
|---|---|---|---|
| 5,790,436 A | | 8/1998 | Chen et al. |
| 6,330,526 B1 | * | 12/2001 | Yasuda ........................... 703/2 |
| 6,356,861 B1 | * | 3/2002 | Singhal et al. ................. 703/2 |

OTHER PUBLICATIONS

Krishna et al, "A Novel Methodology for Statistical Parameter Extraction," 1995 IEEE/ACM International Conference on Computer–Aided Design, pp. 696–699 (Nov. 1995).*

M. Sengupta, et al., "Visualization of Trade–Offs in Optimization of Integrated Circuits with Multiple Objectives" IEEE, pp. 1640–1643, 1997.

M.A. Styblinski, et al., "Statistical Characterization and Optimization of Integrated Circuits Based on Singular Value Deomposition" ICECS, pp. 263–266, 1996.

M. Sengupta, et al., "An Efficient Jacobian Updating Technique for Analog Circuit Optimization" IEEE, pp. 2144–2147, 1995.

Virga, Kathleen L., et al., "Efficient Statistical Analysis of Microwave Circuit Performance Using Design of Experiments," 1993 IEEE MTT–S Digest, pp. 123–126.

Carroll, Jim, et al., "Statistical Computer–Aided Design for Microwave Circuits," IEEE Transactions on Microwave Theory and Techniques, No. 1, Jan. 1996, New York, US, pp. 24–32.

* cited by examiner

*Primary Examiner*—Samuel Broda
(74) *Attorney, Agent, or Firm*—J. Dennis Moore; W. James Brady, III; Frederick J. Telecky, Jr.

(57) ABSTRACT

A computer system (30) and method of operating the same to model worst case performances of an analog circuit is disclosed. The computer system (30) includes disk storage devices for storing a process parameter data base (32), design of the circuit (31), and program instructions for performing the modeling method (33). Under the control of the program instructions, the system computer (22) retrieves the process parameters and desired performances, and performs a designed experiment to determine a Jacobian matrix of the dependence of the performances upon the process parameters. Singular value decomposition of the Jacobian matrix provides a set of singular values and a rotation vector, from which the coefficients of a worst case vector of the process parameters for each of the circuit performances are then derived. The system computer (22) then applies the simulation to the worst case vectors, to evaluate the worst case performances of the designed circuit.

18 Claims, 3 Drawing Sheets

WORST CASE PERFORMANCE MODELING OF ANALOG CIRCUITS

CROSS-REFERENCE TO RELATED APPLICATIONS

This application claims priority under 35 U.S.C. § 119(e)(1) of provisional application No. 60/167,837 filed Nov. 29, 1999.

STATEMENT REGARDING FEDERALLY SPONSORED RESEARCH OR DEVELOPMENT

Not applicable.

BACKGROUND OF THE INVENTION

This invention is in the field of analog circuit design, and is more specifically directed to the modeling of the performance of analog circuits.

Performance modeling has become an important process in the design and manufacture of integrated circuits, both of the digital and analog type. As is fundamental in the art, the realization of an electronic circuit design requires the definition of the layout of the circuit, as physically-realizable devices, according to a selected set of design rules and manufacturing process parameters. Of course, the actual manufacture of the designed circuit will involve variations in the manufacturing process from nominal values in the design, and these variations will affect the eventual performance of the manufactured device. Performance modeling refers to a modeling or simulation technique in which the performance of the designed circuit may be modeled over the set of variations in the process parameters. This modeling can be used to determine the worst case circuit performance that can be expected from a given manufacturing process, to ensure that the circuit, as it will be manufactured, will need product specifications and design goals. Additionally, one may use the results of the modeling to determine the sensitivity of circuit performance to various process parameters.

Conventional performance modeling techniques to derive worst case simulations in digital circuits are generally based upon estimators that relate combinations of process parameters (referred to as " vectors") to the worst case performance measurements of digital gate delays and current drawn. In one conventional approach, worst case performance is derived by simulation of the circuit at each "corner" in the process parameter space, where each corner corresponds to a combination of extremes of the parameters. Of course, as the number of process parameters becomes even somewhat large, the number of "corners" at which simulation is required explodes to a prohibitively high number.

According to another approach, worst case vectors are heuristically determined, based on the observed effects of process and environmental parameters upon delay and current in digital circuits, from which the best case and worst case vectors are determined for the delay and current performance parameters. Models resulting from these vectors are also known as the "weak" and "strong" models. However, current trends of smaller device sizes and lower power supply voltage have greatly reduced the accuracy of historically valid vectors when applied to modern circuits.

A recent approach toward producing valid worst case vectors for digital circuits is based upon a quasi-empirical approach, in which a set of circuits such as inverter chains, ring oscillators, and the like are identified as "Figure of Merit" (FOM) circuits. The circuit designers determine the desired performance from the FOM circuits, extrapolating the determined performance to the overall performance of the larger-scale circuit under design. Statistical models for the corresponding manufacturing process are then applied to the FOM circuits by way of a Monte Carlo experiment, to provide the endpoints of the performance distribution over the process variations. The historically-used worst case vectors are then applied to a Design of Experiment ("DoE") exercise around the worst case vectors, to derive the DoE point most closely corresponding to the upper and lower bounds of the performance distribution from the Monte Carlo experiment. The DoE vectors are then magnified (i.e., multiplied) so that the Monte Carlo performance values fall within the range of the magnified DoE vectors.

This recent approach has provided, in some cases, a reasonable set of worst case vectors for digital circuits. However, because the initial guess used for the DoE is somewhat arbitrary, the resulting model has somewhat limited applicability over manufacturing processes, requiring the generation of the worst case vectors for each manufacturing process flow. It has also been observed that the magnifying of the DoE results causes the inclusion of points, in process space, that would not otherwise be included (i.e., points that do not have a statistically significant likelihood of actually occurring); further, the worst case vectors have been observed to overpredict the range of performance of several circuit topologies. Automation of this approach is also somewhat limited, considering that the application of the historical worst case vector and also the selection of the FOM circuits is somewhat intuitive, thus requiring input from human experts.

Last, but not least, this conventional approach does not translate well to analog circuits. As is known in the art, digital circuits, and particularly the performance parameters of delay and current drawn, vary with process variations in a relatively well-behaved manner. In this regard, worst case process extremes generally translate to worst case performance extremes. This predictable behavior is the basis of the selection of the historically-valid vectors or the DoE starting point. However, it has been observed, in connection with the present invention, that such predictable behavior often does not apply to analog circuits. For example, a worst case vector of an analog circuit may correspond to the combination of several process parameters, none of which are at their process variation extreme. As a result, the generation of worst case vectors for analog circuits, particularly those formed according to state-of-the-art manufacturing processes and design rules, has become difficult if not impossible using conventional worst case modeling techniques.

BRIEF SUMMARY OF THE INVENTION

It is therefore an object of the present invention to provide a methodology for generating worst case model vectors for modern integrated circuit designs.

It is a further object of the present invention to provide such a methodology that can be applied to analog circuits.

It is a further object of the present invention to provide such a methodology in which the number of simulations required is quite modest.

It is a further object of the present invention to provide such a modeling approach that can be readily automated, with applicability to a wider range of circuits and process flows.

Other objects and advantages of the present invention will be apparent to those of ordinary skill in the art having reference to the following specification together with its drawings.

The present invention may be implemented into a computerized method for determining combinations of worst case process parameters for an integrated circuit of either the analog or digital type. Following the selection of the circuit performances that are to be modeled, a designed experiment is performed relative to manufacturing process parameters according to which the circuit is to be realized, from which a transformation vector is derived as a Jacobian matrix, in which each element corresponds to the dependence (e.g., first partial derivative) of a performance relative to a process parameter. Singular value decomposition is then performed to identify the worst case vectors in the process parameter space that cover the range of the performance distributions. These worst case vectors are then scaled to the desired statistical level, and applied to the designed circuit to determine the worst case performance values for that manufacturing process.

DETAILED DESCRIPTION OF THE INVENTION

The present invention will be described herein according to a preferred embodiment thereof, specifically an embodiment in which the worst case manufacturing process conditions, and the resulting worst case circuit performance, are derived for an analog circuit. An analog circuit is selected for use in this exemplary description, considering that conventional worst case modeling techniques are not particularly useful in connection with analog circuits, while the present invention is particularly well-suited for use in the analog domain. Of course, as will be apparent to those skilled in the art having reference to this specification, the present invention may also be applied to digital and mixed-signal (i.e., both analog and digital) circuits. It is therefore contemplated that those skilled in the art, and having reference to this specification, will be readily able to utilize the present invention with these and other circuits and applications.

Theory of Operation

In order to facilitate the detailed description of the preferred embodiment of the invention, the theory of operation of the present invention will first be described. In this regard, a vector x in an n-dimensional linear time invariant inner product space (i.e., $x \in \Re^n$) is utilized to represent a combination of process parameter values. As will be described in further detail hereinbelow, the process parameters represented by vector x include parameters that correspond to the physical construction of devices in the circuit under design (e.g., gate oxide thickness, transistor channel length reduction (from patterned), dopant concentrations), and also include parameters that correspond to measurable electrical parameters having a relatively well-behaved relationship with physical device features (e.g., transistor threshold voltages, flat-band voltages). Initially, the elements of vector x, which are the settings of the n independent parameters, have a distribution of $N(0,1)$, with the null vector $\mathbf{0}$ corresponding to the nominal values of these process parameters. Similarly, a vector y corresponds to a combination of circuit performances, for the analog circuit to be modeled, an an m-dimensional linear time invariant inner product space (i.e., $y \in \Re^m$). According to the present invention, the elements of y are deviations from nominal performance values, such that the null vector $\mathbf{0}$ in space $\Re^m$ corresponds to the set of nominal circuit performances.

One may represent a Jacobian matrix of circuit performance values $y_i$ with respect to process parameters $x_j$ at a current design point as follows:

$$J = \begin{pmatrix} \frac{\partial y_1}{\partial x_1} & \cdots & \frac{\partial y_m}{\partial x_1} \\ \vdots & \ddots & \vdots \\ \frac{\partial y_1}{\partial x_n} & \cdots & \frac{\partial y_m}{\partial x_n} \end{pmatrix}$$

The relationship between circuit performance vector y and process parameter vector x may then be expressed as:

$$y = J^T x$$

The Jacobian matrix J (or its transpose, as the case may be) thus provides a mapping of values from process parameter space $\Re^n$ to the circuit performance space $\Re^m$. According to the present invention, the singular value decomposition of this Jacobian matrix J provides singular value λ from which the worst case vectors may be identified.

The singular value decomposition of Jacobian matrix J of dimension n×m is given by:

$$J_{n \times m} = U_{n \times m} \Lambda_{m \times m} V_{m \times m}$$

in which the subscripts indicate the dimension of the matrices. In this decomposition, matrices U and V may be re presented as orthonormal matrices having elements corresponding to unit vectors, each of the appropriate dimension:

$$U = (u_1 u_2 \ldots u_m)$$

$$V = (v_1 v_2 \ldots v_m)$$

for i=1, 2, . . . , m, and with a diagonal matrix Λ:

$$\Lambda = \begin{pmatrix} \lambda_1 & 0 & \cdots & 0 \\ 0 & \lambda_2 & \cdots & 0 \\ \vdots & \vdots & \ddots & \vdots \\ 0 & 0 & \cdots & \lambda_m \end{pmatrix}$$

having elements $\lambda_i$, for i=1, 2, . . . , m, which correspond to the singular values. For purposes of the present invention, it is useful to arrange these singular values decreasing magnitude:

$$\lambda_i \geq \lambda_{i+1} > 0, \text{ for } i=1, \ldots, m-1$$

According to this singular value decomposition, vectors $u_i$ for $i=1, 2, \ldots, m$ are the singular vectors corresponding to the unique singular values $\lambda_i$, for $i=1, 2, \ldots, m$ in the Jacobian matrix J. Vectors $u_i$ for $i=m+1, m+2, \ldots, n$ are the remaining singular vectors, for which the corresponding singular values are zero.

Figure 1:
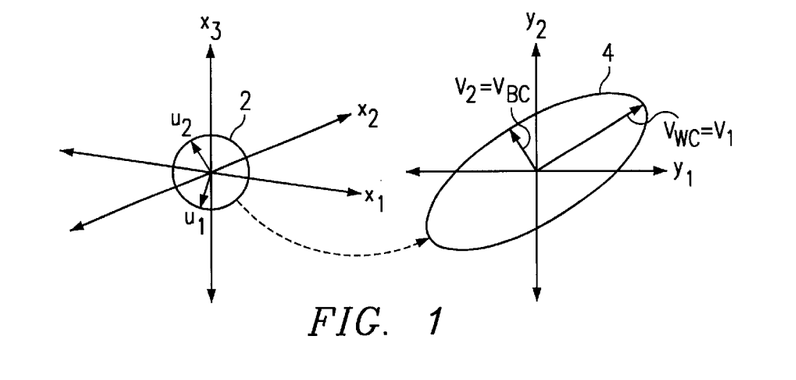
FIG. 1 is a Cartesian diagram illustrating an example of the mapping of vectors from a process parameter space into a circuit performance space.

By way of example, FIG. 1 illustrates singular vectors $u_1$ and $u_2$ in a three-dimensional process parameter space (i.e., having axes $x_1$, $x_2$, $x_3$). Singular vectors $u_1$ and $u_2$ are unit vectors, and hence lie upon unit sphere 2 (which will be an n-dimensional hypersphere, in the general case). Furthermore, as note above, vectors $u_1$ and $u_2$ are orthonormal relative to one another. In the example of FIG. 1, the three-dimensional process space X is to be mapped into a two-dimensional performance space Y, re presented by axes $y_1$, $y_2$. As such, m=2, so that singular vector $u_3$ has a corresponding singular value $\lambda_3=0$. Singular vector $u_3$ is therefore not shown in FIG. 1. As evident in FIG. 1, the mapping from process space X into a two-dimensional performance space Y, carried out by application of the Jacobian matrix $J^T$, maps unit sphere 2, upon which singular vectors $u_1$ and $u_2$ lie, into an ellipse in the two-dimensional space (an m-dimensional hyper-ellipsoid generally). According to the present invention, this mapping permits identification of the worst case vector $v_{WC}$ that causes the greatest deviation on ellipse 4 from the origin of nominal parameters in performance space Y; additionally, one may identify best case vector $v_{BC}$ that is orthonormal to worst case vector $v_{WC}$, and that corresponds to the smallest deviation on ellipse 4 from the nominal parameter point at the origin.

As noted above, singular vectors $u_i$ for $i=1, 2, \ldots, n$ correspond to a set of n orthogonal unit vectors in the n-dimensional process space. These singular vectors u can thus be used as basis vectors for the process space, permitting an arbitrary point P in this space to be represented by a vector p:

$$p = \begin{bmatrix} p_1 \\ p_2 \\ \vdots \\ p_n \end{bmatrix}$$

where $p_i = p \, u_i$ for $i=1, 2, \ldots, n$. A set X of points P may be defined as those points P that lie on the unit hypersphere in the x process parameter space, and that satisfy:

$$p_1^2 + p_2^2 + p_3^2 + \ldots + p_n^2 = \sum_{i=1}^{n} p_i^2 = 1$$

In the statistical sense, each of the points P lying on the unit hypersphere have an equal probability of occurring in the process parameter space.

As noted above, mapping from the process parameter space to the performance space as shown in FIG. 1 may be performed by:

$$y = J^T x$$

An arbitrary vector x in the process parameter space may be selected as $[p_1, p_2, \ldots, p_n]^T$ using the vectors $u_i$; for $i=1$, 2, \ldots, n; this is a similar representation as noted above for vector p. One may therefore express this arbitrary vector x as:

$$x = p_1 u_1 + p_2 u_2 + \ldots + p_n u_n = \sum_{i=1}^{n} p_i u_i$$

The transformation:

$$y = J^T x$$

may thus be expressed as:

$$y = J^T x = V^T \Lambda U^T x = V^T \Lambda \begin{pmatrix} u_1^T \\ u_2^T \\ \vdots \\ u_m^T \end{pmatrix} (p_1 u_1 + p_2 u_2 + \ldots + p_n u_n)$$

and thus:

$$y = V^T \Lambda \begin{pmatrix} p_1 \\ p_2 \\ \vdots \\ p_m \end{pmatrix} = V^T \Lambda p$$

where p is an m-dimensional vector:

$$p = \begin{bmatrix} p_1 \\ p_2 \\ \vdots \\ p_m \end{bmatrix}$$

According to the theory of operation of the present invention, it is useful to partition the vectors used in the transformation or mapping from process parameter space to performance space, considering that, in the typical case where more process parameters exist than performance values, some elements of vectors in process parameter space will generally have no effect on the performance vector. In the above transformation to vector y, it is apparent that some of the components of point p, namely those addends having an index value greater than m, are not multiplied by the matrix $U^T$ or that:

$$u_i^T u_j = 0 \, \forall i=1,2, \ldots, m \text{ and } j=m+1, m+2, \ldots, n$$

The elements $p_{m+1}, p_{m+2}, \ldots, p_n$ therefore do not have any effect upon the transformed vector y. Accordingly, referring back to the set X of points on the hypersphere in process parameter space X, only a subset of X need be considered:

$$\sum_{i=1}^{m} p_i^2 = 1$$

Figure 2:
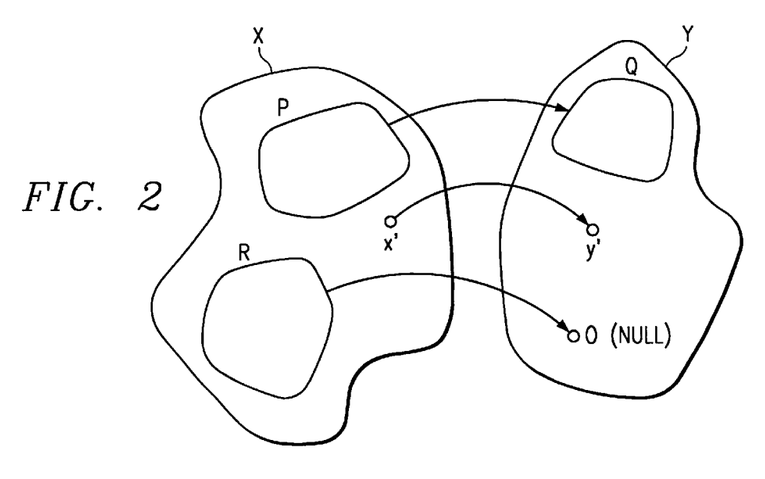
FIG. 2 is a set diagram illustrating an example of the mapping of vectors from process parameter space into circuit performance space where certain of the process parameters do not have a significant effect upon the performance values.

Referring now to FIG. 2, the rationale for constraining the set of p values will now be illustrated by way of a general example of the mapping of points from n-dimensional process parameter space X to m-dimensional performance space Y, by way of the Jacobian matrix $J^T$ as described above. In the general case, as noted above, vector x in process parameter space X corresponds to the case in which:

$$p_1^2 + p_2^2 + p_3^2 + \ldots + p_m^2 + p_{m+1}^2 + \ldots + p_n^2 = \sum_{i=1}^{n} p_i^2 = 1$$

Vector x' in FIG. 2 is an example of such a general vector. Vector x maps to a vector y in performance space Y by way of:

$$y = J^T x \, \forall x \in X$$

as shown in FIG. 2 by the example of vector y'. Subset P of process parameter space Y refers to those vectors x for which:

$$p_1^2 + p_2^2 + p_3^2 + \ldots + p_m^2 = \sum_{i=1}^{m} p_i^2 = 1$$

and also $$p_{m+1} = p_{m+2} = \ldots = p_n = 0$$

This subset P maps to subset Q in performance space Y, by way of:

$$y = J^T x \, \forall x \in P$$

However, as noted above, the singular value decomposition provides the result:

$$y = V^T \Lambda \begin{pmatrix} p_1 \\ p_2 \\ \vdots \\ p_m \end{pmatrix} = V^T \Lambda p$$

Accordingly, a subset R in process parameter space X exits having vectors x that satisfy:

$$p_{m+1}^2 + p_{m+2}^2 + p_{m+3}^2 + \ldots + p_n^2 = \sum_{i=m+1}^{n} p_i^2 = 1$$

and also $$p_1 = p_2 = \ldots p_n = 0$$

The vectors x in subset R therefore do not have any influence upon performance space Y, and therefore map to the null vector 0 in space Y, as shown in FIG. 2.

Consider a vector y' in performance space Y that is not within subset Q, such that $y' \subset Y \not\subset Q$. A vector x' is in process parameter space X such that $y' = J^T x'$, which has elements $p_1$, $p_2$, ..., $p_n$ with finite values. It can be demonstrated that a constant k>1 exists, for vector x', such that:

$$k \sum_{i=1}^{m} p_i^2 = 1$$

We know, however, that elements $p_{m+1}$, $p_{m+2}$, ..., do not contribute to vector y' (i.e., are all equal to zero). Accordingly, the vector $J^T(kx')$ will map into subset Q (since the sum of its p elements equals one). Accordingly, there is a vector $y_q \subset Q$ such that $y_q = ky'$. The subset Q thus forms an envelope encompassing all vectors y meeting the constraints of mapping from the Jacobian matrix and for which the sum of the squares of their p elements equals unity. Since subset Q can be derived by mapping from subset P in process parameter space X, only the vectors x in subset P are of concern:

$$\sum_{i=1}^{m} p_i^2 = 1, \quad p_i = 0 \, \forall \, i > m$$

It will be recalled from the singular value decomposition described above that:

$$y = V^T \Lambda \begin{pmatrix} p_1 \\ p_2 \\ \vdots \\ p_m \end{pmatrix} = V^T \Lambda p$$

One may thus consider:

$$\|y\|^2 = y^T y$$
$$= (V^T \Lambda p)^T (V^T \Lambda p)$$
$$= p^T \Lambda V V^T \Lambda p$$
$$= (\Lambda p)^T (\Lambda p)$$
$$= \lambda_1^2 p_1^2 + \lambda_2^2 p_2^2 + \ldots + \lambda_m^2 p_m^2$$
$$= \lambda_1^2 \left( p_1^2 + \left(\frac{\lambda_2}{\lambda_1}\right)^2 p_2^2 + \ldots + \left(\frac{\lambda_m}{\lambda_1}\right)^2 p_m^2 \right)$$

The values of $\lambda$ correspond, as noted above, to the singular values of the mapping from process parameter space to performance space, with $\lambda_i \geq \lambda_{i+1} > 0$, for i=1, ..., m-1, and also with $$\sum_{i=1}^{m} p_i^2 = 1.$$

From the above, the magnitude of y may be seen as:

$$\|y\|^2 = \lambda_1^2 p_1^2 + \lambda_2^2 p_2^2 + \ldots + \lambda_m^2 p_m^2$$
$$\leq \lambda_1^2 p_1^2 + \lambda_1^2 p_2^2 + \ldots + \lambda_m^2 p_m^2 \quad [\text{because } \lambda_2 \leq \lambda_1]$$
$$\leq \lambda_1^2 p_1^2 + \lambda_1^2 p_2^2 + \ldots + \lambda_1^2 p_m^2$$
$$\|y\|^2 \leq \lambda_1^2 p_1^2 + \lambda_1^2 p_2^2 + \ldots + \lambda_1^2 p_m^2 = \lambda_1^2 (p_1^2 + p_2^2 + \ldots + p_m^2)$$

but because $$\sum_{i=1}^{m} p_i^2 = 1,$$

then:

$$\|y\|^2 \leq \lambda_1^2$$

One may therefore numerically express the maximum displacement in performance space Y as $\|y\|_{max} \leq \lambda_1$. Using the above derivation, $\|y\|^2$ is maximized with respect to x when:

$$p_1 = 1, \, p_2 = p_3 = \ldots = p_m = 0$$

The vector y having the maximum magnitude $\|y\|^2$ corresponds to the worst case vector in performance space Y, as its magnitude is furthest from the origin, or null point. Given the foregoing, this worst case situation is obtained from the first singular vector $u_1$ for the perturbation in process parameter space. One may derive the set of vectors x orthogonal to singular vector $u_1$ (i.e., $x \perp u_1$) by setting $p_1$ to zero. From the maximizing of $\|y\|^2$ in this case, the next maximum displacement occurs with $p_2=1$ and all other p values equals to zero; this corresponds, of course, to vector $u_2$.

One may geometrically interpret this mapping relationship by the realization that:

$$\|y\|^2 = (\Lambda p)^T (\Lambda p)$$

when constrained by:

$$\sum_{i=1}^{m} p_i^2 = 1$$

represents a hyper-ellipsoid in m-dimensional performance space Y. As such, the mapping of the set of vectors in subset P of FIG. 2 from process parameter space X to performance space Y may be considered as performing the sequence of operations of:

1. Decomposing vector x into a set of orthogonal vectors $p_1 u_i$ for i=1, 2, ..., m;
2. Magnifying the orthogonal vectors by their corresponding singular values $\lambda_i$, for i=1, 2, ..., m;
3. Rotating the resulting magnified vectors by matrix V; and
4. Summing the m rotated vectors to form vector y, in subset Q (FIG. 2).

As a result, the subset Q of vectors y form a hyper-ellipsoid in performance space Y, where the hyper-ellipsoid has major axes given by $2\lambda_i$, for i=1, 2, ..., m. The shape of the hyper-ellipsoid depends somewhat strongly upon the ratio $\lambda_1/\lambda_2$ of the two large singular values; an increase in this ratio will cause the hyper-ellipsoid to have its longest major axis $2\lambda_1$ substantially larger than any other axis, becoming a straight line in the degenerate case. This results when performances are strongly correlated with one another, and is made evident from observation of the singular value $\lambda$ themselves. In this highly-correlated situation, one may validly assume that the end points of the hyper-ellipsoid at the ends of the $\lambda_1$ major axis correspond to the worst cases for all the performances (i.e., furthest distance from the origin in performance space Y), such that the $u_1$ vector in process parameter space X is the worst case vector and its orthogonal reflection is the best case vector. Digital circuits typically operate in this highly correlated condition, such that the worst case vectors can be readily identified.

Figure 3A:
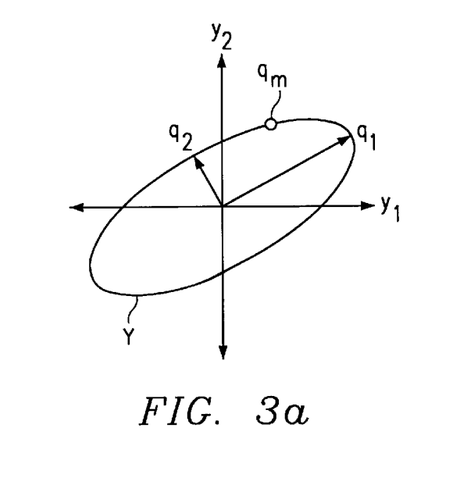
FIGS. 3a and 3b are Cartesian diagrams illustrating an example of worst case performance values of an analog circuit relative to performance axes in performance space.
Figure 3B:
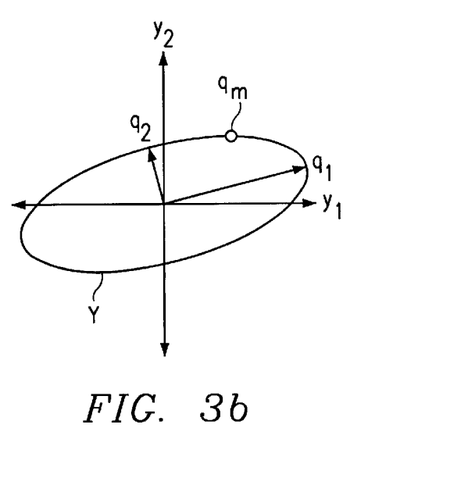

It has been observed, however, in connection with the present invention, that analog circuits typically do not have such highly correlated behavior, instead having their larger singular values (e.g., $\lambda_1$, $\lambda_2$) comparable in magnitude. Further, the length (magnitude) of a vector y provides no indication of its direction, and as such the foregoing magnitude considerations can fall short of providing a worst case solution. In such a case, more than one pair of worst cases may exist, and the larger axes of the hyper-ellipsoid in performance space Y may not approximate the worst case conditions. FIGS. 3a and 3b illustrate an example of such a condition, as can be encountered in analog circuit simulation.

In FIG. 3a, a two-dimensional (dimensions $y_1$ and $y_2$) performance space Y is shown, in which vectors $q_1$ and $q_2$ are mapped from corresponding singular vectors $u_1$, $u_2$ in process parameter space (not shown). In this example, consider that the worst case value of performance $y_2$ (i.e., the largest deviation of performance space Y in the $y_2$ dimension) is desired; this point is illustrated as point $q_m$. FIG. 3b illustrates an alternative mapping, in which different vectors $q_1$ and $q_2$ are mapped from their corresponding singular vectors $u_1$, $u_2$. In the case of FIG. 3a, the distance $y_2(q_2)$ in the $y_2$ direction for vector $q_2$ is less than the distance $y_2(q_1)$ for vector $q_1$, while in the case of FIG. 3b, the distance $y_2(q_2)$ in the $y_2$ direction for vector $q_2$ is greater than the distance $y_2(q_1)$ for vector $q_1$. In both cases, however, the distances $y_2(q_1)$ are less than the true worst case distance in the $y_2$ dimension, namely $y_2(q_m)$. The similarity in the singular values giving rise to the mappings of FIGS. 3a and 3b thus prevent the direct determination of the true worst case performance.

One may attempt to resolve this situation by working from a known set of singular (or worst case) vectors (e.g. $\pm 3u_1$ and $\pm 3u_2$) to simulate the circuit operation to test each of the worst case corner points $q_1$, $q_2$, thus deriving the highest and lowest deviation values for each individual performance (i.e., from the origin of performance space Y). Some amount of error may be expected in this approach, as evident from FIGS. 3a and 3b. In the case of many digital circuits which, as note above, have well-correlated performances, and which typically have only one or two singular values of significance, it is contemplated that the loss of coverage may be tolerable considering that both the vector end points $q_i$ (where i corresponds to the index of decreasing magnitude singular values) and also the true worst case performances (e.g., $q_m$) lie close to the edge of the statistical distribution of the performance space Y.

This approach of testing worst case corner points will require 2p simulations of the analog circuit, where p is the number of performances of the circuit under consideration. In the preferred embodiment of the invention, however, as will be described in further detail hereinbelow, the circuit operation is simulated at the end points of scaled singular vectors ($u_1$, $u_2$ ...) that correspond to the significant singular values ($\lambda_1$, $\lambda_2$, ...). This approach instead requires only 2k simulations, where k is the number of significant singular values; according to the present invention, the number of singular values of any significance is contemplated to be less than the number of performances to be modeled.

Additionally, as noted above, analog circuits typically do not have previously known worst case vectors, as the circuit performances are not well-correlated because of multiple significant singular values of comparable magnitude. According to the present invention, therefore, the derivation of the Jacobian matrix itself from a designed experiment is used to analytically identify the true absolute maxima and minima for the mapping, in order to determine the previously unknown worst case vectors. The theory of operation of this analytical worst case determination will now be described.

As will be further described hereinbelow, the Jacobian matrix for a given set of process parameters and their resulting circuit performances may be readily derived by way of several circuit simulations. Preferably, classical or Taguchi Design of Experiment techniques may be used to minimize the number of simulation runs that are performed. According to the preferred embodiment of the invention, only first order effects (i.e., first partial derivatives) are of interest; accordingly, a level 2 Orthogonal Array-based design is contemplated to be sufficient to evaluate the Jacobian matrix. Following the experiment, the Jacobian matrix by way of which partial derivatives of circuit performances with respect to process parameters can then be derived by conventional techniques. Singular value decomposition of the Jacobian, as noted above, can then render the matrix of singular values $\lambda_i$ process parameter space X.

According to the present invention, the worst case performance vectors can be derived from the singular vectors, by considering the transformation from unit vectors with magnitudes $p_i$ in process space to vectors y in performance space. Recall from above that:

$$y = V^T \Lambda \begin{pmatrix} p_1 \\ p_2 \\ \vdots \\ p_m \end{pmatrix} = V^T \Lambda p$$

Consider vector $e_k$ to be the kth unit vector in performance space Y, such that the ith element of $e_k$ is given by:

$$e_{k,i} = \begin{cases} 1: & i = k \\ 0: & \text{otherwise} \end{cases}$$

The kth performance $y_k$ in performance space Y can therefore be derived as:

$$y_k = e_k^T V^T \Lambda p$$

According to the present invention, identification of the best and worst case values of this kth performance $y_k$ is desired. These extrema may be found by minimizing and maximizing the function:

$$f(p) = y_k = e_k^T V^T \Lambda p$$

subject to the constraint:

$$g(p) = [p^T p - 1] = 0$$

which forces the endpoint of vector p onto the unit sphere in process parameter space.

The constrained optimization of function f(p), constrained by the unit hyper-sphere condition of g(p), may be performed by way of Lagrange multipliers. For a constant $\lambda$, the polynomial $L(p, \lambda)$ may be constructed:

$$L(p, \lambda) = f(p) + \lambda g(p)$$

where:

$$f(p) = \lambda_1 v_{k1} p_1 + \lambda_2 v_{k2} p_2 + \ldots + \lambda_m v_{km} p_m$$

$$g(p) = p_1^2 + p_2^2 + p_3^2 + \ldots + p_m^2 - 1$$

One may differentiate these functions f(p) and g(p) with respect to p and $\lambda$ to produce a set of m+1 equations of the form:

$$\lambda_i v_{ki} + 2\lambda p_i = 0, \text{ for } i=1, 2, \ldots, m$$

$$p_1^2 + p_2^2 + p_3^3 + \ldots + p_m^2 = 1$$

Solving the upper equation for $p_i$ one obtains the m+1 equations:

$$p_i = -\frac{\lambda_i v_{ki}}{2\lambda}, \text{ for } i = 1, 2, \ldots, m$$

Substitution of these expressions of $p_i$ into the sum of the squares of the p's renders:

$$\frac{\lambda_1^2 v_{k1}^2}{4\lambda^2} + \frac{\lambda_2^2 v_{k2}^2}{4\lambda^2} + \frac{\lambda_3^2 v_{k3}^2}{4\lambda^2} + \ldots + \frac{\lambda_m^2 v_{km}^2}{4\lambda^2} = 1$$

This renders the result:

$$4\lambda^2 = \sum \lambda_i^2 v_{ki}^2$$

and therefore:

$$\lambda = \pm \frac{1}{2} \sqrt{\sum \lambda_i^2 v_{ki}^2}$$

As noted above, the terms $\lambda_i$ and $v_{ki}$ are derived from the singular value decomposition. These values may therefore be applied to the above equation to determine two values of $\lambda$ and, from these values of $\lambda$, the pair of vectors $p_k$ that will generate the minimum and maximum worst case values for the kth performance.

The maxima and minima of each value $y_k$ can be tested for these two values of $\lambda$, by reference to the polynomial $L(p, \lambda)$ noted above. Differentiation of $L(p, \lambda)$ with respect to vector p provides:

$$\nabla_p(L(p,\lambda)) = e_k^T V^T \Lambda + 2\lambda p$$

The second derivative with respect to vector p provides:

$$\nabla_p^2(L(p,\lambda)) = 2\lambda$$

As evident from the derivation of the $\lambda$ values, one will be negative and the other will be positive; accordingly, the second derivatives will include both a negative and positive choice. The $\lambda$ value providing a negative second derivative will derive the vector p for the maximum value of $y_k$, while the $\lambda$ providing the positive second derivative will derive the vector p for the minimum value.

Repeating this solution of the $\lambda$ values for each of the k performances therefor provides a unique maximum and minimum for each of the m performances in performance space Y. The worst case models are therefore readily derived form the singular values.

Preferred Embodiment of the Invention

Given the foregoing discussion of the theory of operation of the present invention, the preferred embodiment of the present invention will now be described in detail. As will be apparent from the following description, an exemplary implemetation of the preferred embodiment is applied in a computer-based automated manner to the design and simulation of an analog circuit. It is of course contemplated that the present invention may also be applied to digital circuits, mixed-signal circuits, and other systems for which the complex behavior is to be simulated and analyzed.

Figure 4:
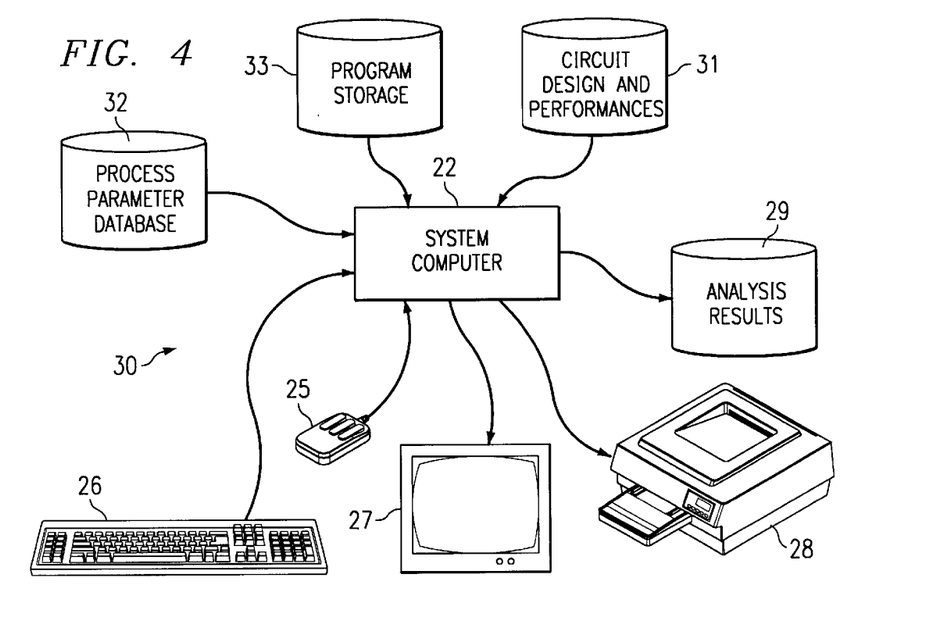
FIG. 4 is an electrical diagram, in block form, of a computer system for performing circuit modeling according to the preferred embodiment of the invention.

The preferred embodiment of the invention is primarily intended for automated operation by way of a digital computer. FIG. 4 illustrates the generalized construction of computer system 30 suitable for performing the design evaluation according to the preferred embodiment of invention.

Computer system 30 includes system computer 22, which executes the appropriate operations necessary for performing the operations to be described hereinbelow. By way of example, any conventional high performance personal computer or workstation, either in standalone form or in a network configuration, and that is suitable for circuit simulation according to conventional techniques is contemplated to be of sufficient computational capacity for also performing the method described herein. For example, workstations such as the Ultra 10 workstations available from Sun Microsystems, are contemplated to have sufficient computational power for use in connection with the present invention.

As shown in FIG. 4 system computer 22 is connected to various fixed disk storage devices 29, 31, 32, 33, which may correspond to logical disk storage partitions or to actual separate disk storage units, either provided within the workstation of computer system 30 or connected thereto by way of a network. Program storage device 33 includes the program instructions by way of which system computer 22 is programmed to perform the circuit evaluation operations described hereinbelow according to the preferred embodiment of the invention. It is contemplated that these program instructions are preferably written in a high level language, such as Java, Perl, C++, Python, or the like; different modules of these program instructions may, if desired, be written in different languages. In general, Java is particularly preferred for use in connection with the preferred embodiment of the present invention, considering its support for object oriented programming constructs, ease of implementation of graphical user interface (GUI) features, and portability of the class files across different platforms. Of course, the memory medium storing the computer program may be of any conventional type used for the storage of computer programs, including hard disk drives (e.g., disk storage device 33), floppy disks, CD-ROM disks, magnetic tape, and the like.

Data to be used by system computer 22 in executing the program instructions stored in program storage device 33 includes a data base of the circuit under design and evaluation, as well as identification of those circuit performances to be evaluated, as stored in circuit storage device 31. The input data further includes a data base of the process parameters representing the manufacturing process by way of which the circuit is to be fabricated, as well as statistical variations thereof, as stored in process parameters data base storage device 32. Disk storage device 29 is provided for storage of the results of the evaluation performed by system computer 22 according to the preferred embodiment of the invention. Of course, while disk storage devices 29, 31, 32, 33 are illustrated as separate devices, a single disk storage device may of course be used to store any and all of the program instructions, measurement data, and results as desired.

According to the preferred embodiment of the invention, system computer 22 presents output primarily onto graphics display 27, or alternatively via printer 28. Further in the alternative, as noted above, system computer 22 may store the results of the analysis described hereinbelow on disk storage device 29, for later use and further analysis. Keyboard 26 and pointing device 25 (e.g., a mouse, trackball, or the like) are provided with system computer 22 to enable interactive operation.

Figure 5:
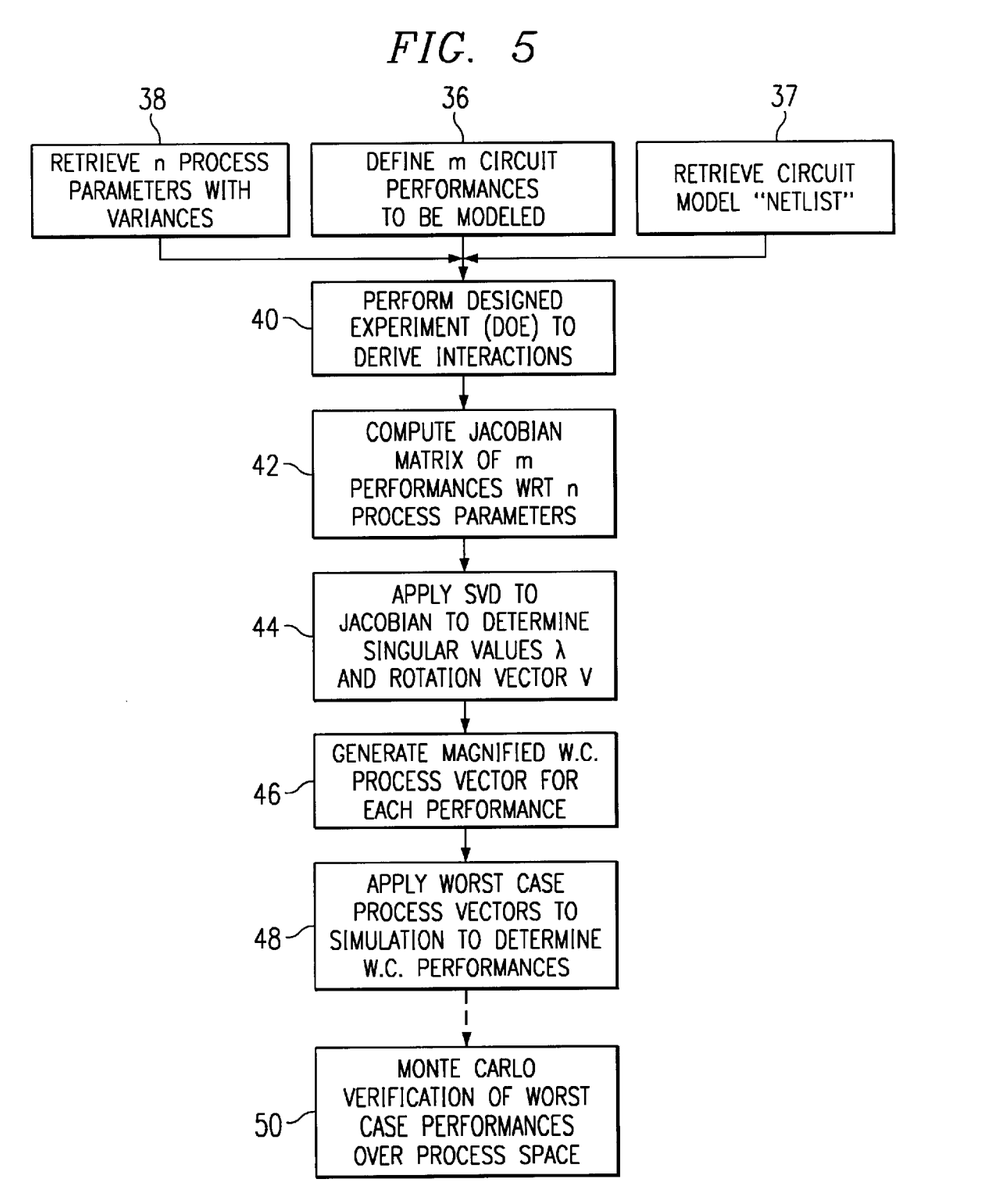
FIG. 5 is a flow diagram illustrating the operation of a modeling process according to the preferred embodiment of the invention.

Referring now to FIG. 5, in combination with FIG. 4, the operation of computer system 30 according to the preferred embodiment of the present invention will now be described in detail. As noted throughout the foregoing description, the result desired from this process is a determination of the worst case values of certain performance parameters of a designed electronic circuit, for given manufacturing process. The worst case performances can then be analyzed by the circuit designer to determine whether the designed circuit will meet its desired specifications and, if not, to make certain modifications to the design. It is contemplated, as noted above, that the present invention is particularly applicable to analog circuit such as operational amplifiers, power amplifiers, transceivers, equalizers, oscillators, level shifters, and the like, given that conventional modeling approaches are not sufficient for accurate worst case modeling of such circuits; of course, the present invention may also be applied to digital circuits and to mixed-signal circuits, as well.

The operation of the preferred embodiment of the invention begins with processes 36 37, 38, in which system computer 22 defines the circuit and process to be modeled, and selects the results that are desired to be modeled. In process 36, the human user, by reference to the data stored in circuit design and performance storage device 31, defines and selects the m circuit performances that are to be modeled. These circuit performances includes parameters by way of which the functionality of the designed circuit may be measured. Examples of useful performances for analog circuits include low frequency gain, high frequency gain, phase margin, gain margin, noise immunity at low and high frequency, common-mode refection ratio (CMRR), power supply noise rejection ratio for both power supplies, settling time, and the like; in addition, if desired, the specific statistical bounds for which the modeling is to be performed (e.g., evaluation of the worst case performances to ±3σ, or three standard deviations) my also be specified in process 46. In process 37, the details of the design of the circuit are retrieved from circuit design and performance storage device 31. For example, a netlist of the modes in the circuit, such as used in SPICE modeling, may be retrieved in process 37.

In process 38, system computer 22 retrieves the process specifications and parameters, including measures (e.g., standard deviation) of the variability of the process parameters, from process parameter data base storage device 32. According to this preferred embodiment of the invention, the number n of the retrieved process parameters is generally larger than the number m of the performances to be modeled. The process parameters retrieved in process 38 includes both actual physical process measurements and also electrical parameters that strongly correlate to the physical construction of an integrated circuit. For example, the retrieved process parameters may include such parameters as gate oxide thickness, doping concentrations, diffusion thickness, transistor channel length reduction, and other physical measurements. Additionally, the retrieved process parameters may include electrical transistor parameters such as threshold voltage, flatband voltages, resistivities, and the like, as parameters such as these correlate directly and strongly with the physical construction of the integrated circuit.

In process 40, system computer 22 generates a Design of Experiment by way of which the dependence of each of the m performances upon each of the n process parameters is evaluated. This evaluation is carried out by execution of a simulation of the designed circuit for each of multiple sets of process parameters, where each set of process parameter values generally corresponds to a combination of statistical extremes (i.e., plus or minus a selected number of standard deviations from nominal) of the process parameters to be. In a brute force fashion, of course, the effect of the process parameters may be determined by applying each combination of extreme values of the parameters; however, the number of simulations required in this approach for m process parameters is $2^m$. According to the preferred embodiment of the invention, therefore, the technique of Orthogonal Array Design of Experiment (also referred to as DoE, and a subset of which is referred as Taguchi experimental designs or Taguchi matrices) is used in process 40 to select an informative number of simulations from which the necessary conclusions may be drawn. For example, the use of Orthogonal Array Design of Experiment techniques may select sixteen combinations of eight process parameters for simulation, while still providing accurate and informative results.

Process 40 selects the sets of process parameter values according to the appropriate DoE technique, and then performs simulation of the designed circuit for each set. The simulation program executed by system computer 22 will correspond to the conventional simulation product used in connection with the desired circuit. These simulations will thus provide an array of performance values, with each column resulting from the application of an input vector of process parameter values.

In process 42, system computer 22 computes the Jacobian matrix of the m performances with respect to the n process parameters, based upon the results of the DoE simulations performed in process 40. The derivation of the Jacobian in process 42 may be performed according to conventional techniques that determine the gradient of each performance with respect to each process parameter. Numerical techniques for determining the Jacobian are well known in the art, and may be readily performed by system computer 22 of modern construction.

Following process 44, system computer 22 next performs singular value decomposition of the Jacobian matrix. As described above in connection with the theory of operation of the present invention, the singular vale decomposition of the Jacobian matrix corresponds to:

$$J_{n \times m} = U_{n \times m} \Lambda_{m \times m} V_{m \times m}$$

where the matrix U corresponds to m vectors of the n process parameters, each of unit length, where the matrix $\Lambda$ corresponds to the diagonal matrix of singular values $\lambda_i$, and wherein the matrix V indicates the rotation of the unit vectors of matrix U as the process parameters are mapped into the space of performances. Numerous well known numerical techniques are available for use by system computer 22 in performing singular value decomposition process 42, examples of which include Jacobi Rotation. As a result of the singular value decomposition performed in process 44, the singular values $\lambda_i$ are known, along with the elements of each of the matrices U, V. These elements are then stored in the memory of computer system 30, for further use in the determination of the worst case performances of the designed circuit.

Following singular value decomposition process 44, system computer 22 next performs process 46 to derive the magnified worst case process vector for each of the m performances being modeled for the designed circuit. As noted above, the desired result of this process is the identification of a vector $p_k$ in the process space that, when mapped to the performance space, corresponds to a worst case vector for the kth circuit performance. As noted above, a vector p may be expressed as $p_1 u_1 + p_2 u_2 + \ldots + p_m u_m$ where each $u_i$ is a basis vector in the process parameter space (and with coefficients $p_i$ for i>m all being zero). Accordingly, the result of process 46 is the derivation of a vector p (specifically, the values of $p_i$ term) for each performance, that maps to the worst case value for that performance.

Figure 6:
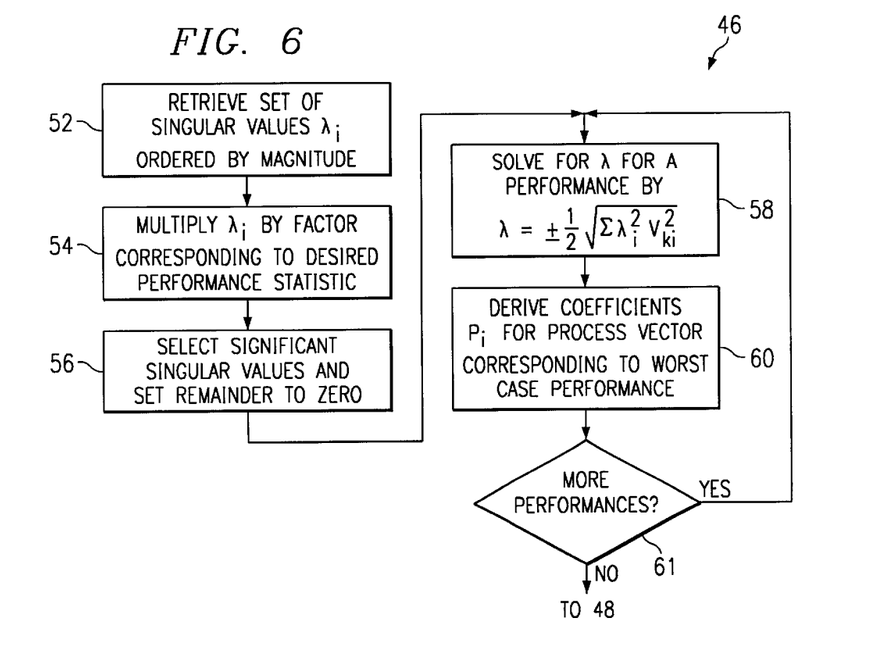
FIG. 6 is a flow diagram illustrating the operation of the generation of worst case process parameter vectors in the method of FIG. 5 according to the preferred embodiment of the invention.

Attention is directed, to FIG. 6, in connection with which the steps involved in process 46 according to the preferred embodiment of the invention will now be described in detail.

The execution of process 46 begins, according to the preferred embodiment of the invention, with process 52 in which the set of singular values $\lambda_i$ derived in process 52 are retrieved from memory. If not previously ordered, the singular values $\lambda_i$ derived in order of decreasing magnitude at this time, such that $\lambda_i \geq \lambda_{i+1} > 0$, for i=1, . . . , m−1. The singular values $\lambda_i$ for i>m are, as noted above, equal to zero, and as such correspond to unit vectors in process parameter space that have no effect upon the circuit performances.

Following the retrieval of process 52, system computer 22 multiplies these singular values $\lambda_i$ by a factor corresponding to the desired performance statistic. As is well known in the field of circuit simulation and modeling, worst case simulations are typically carried out for a given statistical limit. For example, a conservative design methodology will often seek the worst case performance of a circuit to ±3 standard deviations from the nominal value. Upon selection of the desired statistical factor, system computer 22 executes process 54 to multiply each of the singular vectors by the selected factor.

In process 56, system computer 22 next selects those singular values $\lambda_i$ that have a sufficiently large magnitude as to be significant in the derivation of the worst case performances. The selection of singular values $\lambda_i$, or the threshold magnitude for making such selection, may be made in an automated manner, according to a preselected threshold value or other criteria (e.g., considering a singular value $\lambda_i$ as insignificant when it is less than a preselected percentage, such as 5%, of the largest singular value). Alternatively, the singular values $\lambda_i$ may be selected in an interactive manner by a human user, for example by way of keyboard 26 and pointing device 27 directing operations by way of a graphical user interface with system computer 22. It is contemplated that, for many designed circuits, an obvious cutoff will be apparent to the human user, in that a few to several singular values $\lambda_i$ will typically be quite significant relative to the remainder. Following selection of the singular values $\lambda_i$ to be used in the worst case vector generation, the remaining singular values $\lambda_i$, for i greater than the value of the selection, are set to zero.

System computer 22 next performs process 58, by way of which the value of the constant $\lambda$ is determined for one of the circuit performances being modeled. As noted above, the values of the $p_i$ coefficients of the process space vector p that maps to the worst case value of the modeled performance may be determined from:

$$p_i = -\frac{\lambda_i v_{ki}}{2\lambda}, \text{ for } i = 1, 2, \ldots, m$$

thus requiring the solution of constant $\lambda$, from the singular values $\lambda_i$ and rotational vector elements $v_{ki}$ as noted above, and according to:

$$\lambda = \pm \frac{1}{2} \sqrt{\sum \lambda_i^2 v_{ki}^2}$$

Also as noted above, the negative value of $\lambda$ derives the process space vector p for the maximum value of $y_k$ for the kth performance, which is the worst case performance sought to be identified according to the preferred embodiment of the invention. This negative value of $\lambda$ is thus calculated by system computer 22 and stored in its memory, for the kth performance, in process 58 by way of this summation.

In process 60, system computer determines the coefficients $p_i$ for the process space vector $p_k$ which renders the worst case value of the kth performance. As noted above, once the negative value of constant $\lambda$ is determined in process 58, the coefficients $p_i$ may be readily calculated from:

$$p_i = -\frac{\lambda_i v_{ki}}{2\lambda}, \text{ for } i = 1, 2, \ldots, m$$

for performance k. This set of m coefficients $p_i$ thus defines the point, in process parameter space X, that results in the worst case value of performance k. These values are stored, in the memory of computer system 30, in association with performance k for output or later use, as will be described below.

Decision 61 is then performed to determine if additional ones of the m performances remain to have their worst case process vectors defined. If so (decision 61 is YES), processes 58 and 60 are repeated for the next performance in the set, with the resulting worst case process vector coefficients $p_i$ stored in memory in association therewith. Upon the worst case determination for each of the m desired performances (decision 61 is NO), control passes to process 48, as shown in FIG. 5.

In process 48, system computer 22 evaluates the modeled worst case performance of the designed circuit by applying the worst case vectors determined in process 48 to the circuit simulation program (e.g., SPICE, etc.). Process 48 is carried out by the retrieval of the worst case vectors (i.e., the m sets of vector coefficient $p_i$ that were derived in process 46) from memory, and applying each worst case vector from process space as an input to the simulation. The result of the simulation, for a given worst case process space vector, will output the simulated worst case performance value (i.e., for the one of the m performances associated with the given worst case process space vector) of the designed circuit. Process 48 repeats this simulation for each of the performances for which simulation is desired, and for which a worst case process space vector was determined in process 46. These worst case performances are then stored in disk storage device 29, or output by way of graphics display 27 or printer 28, as desired.

From the completion of process 46, the circuit designer obtains a accurate determination of the worst case performances of the designed circuit, as may be expected from the manufacturing process of which the process parameters were applied. Armed with this information, the designer can take such actions as are appropriate in response to the worst case performance results. For example, the worst case performances can be compared against the product specifications of the circuit to determine whether the designed circuit can meet these specifications (or, if not, an expected yield of the circuit to the specification). Additionally, if the worst case performance of the designed circuit is not acceptable, changes in the design or selection of a different manufacturing process may be indicated.

Referring back to FIG. 5, upon completion of the determination of the worst case performance values for the designed circuit, an optional verification process 50 may be executed as desired. Process 50, which may also be performed by system computer 22, is a Monte Carlo test that is executed by randomly selecting process parameter values (i.e., randomly selecting vectors in process space) and applying the selected values to the simulation program to model the performances of the designed circuit for the process parameters. The random selection and simulation is repeated for a statistically significant number of repetitions (e.g., on the order of 500 to 1000), such that statistical worst case values of circuit performances may be estimated. Such Monte Carlo simulation of circuit performance is, of course, a well-known technique in the art. In this manner, the accuracy of the worst case modeling performed according to the preferred embodiment of the invention can be evaluated.

Of course, it is contemplated that Monte Carlo verification process 50 will not be performed for every circuit design and process combination, as the large number of simulations performed in process 50 will themselves be costly and cumbersome. However, it is contemplated that the applicability of the modeling approach according to the preferred embodiment of the invention may be verified by Monte Carlo testing for a few to several circuit and process combinations, such that the process may be used with confidence for other designs and processes.

According to the preferred embodiment of the invention, therefore, accurate worst case performance modeling of complex electronic circuits may be performed to evaluate those circuits for which conventional simulation and modeling techniques are not sufficiently accurate. As noted above, the present invention is contemplated to be particularly well-suited for analog circuits in which performance values generally are not well-correlated with one another or with process and manufacturing parameters, such poor correlation resulting in the shortfall of conventional modeling technologies. Furthermore, according to the present invention, the worst case modeling of these difficult circuits is quite efficient. In this regard, excluding any Monte Carlo verification testing, the number of simulations necessary for the worst case modeling is quite low, as simulations are only required in the Orthogonal Array DoE generation of the Jacobian matrix, and for the application of the derived worst case process space vectors to evaluate the worst case performances. For example, the worst case modeling of up to eight performances relative to eight process parameters may be carried out by twenty-two simulations: sixteen simulations required by the DoE of the eight process parameters, and six simulations for the magnified vectors corresponding to the three highest singular values.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of modeling the performance of an electronic circuit, comprising the steps of:

retrieving, from a memory, model parameters of the circuit;

retrieving, from a memory, manufacturing process parameters corresponding to a manufacturing process by way of which the circuit may be fabricated;

operating a computer to derive a Jacobian matrix corresponding to the dependence of a plurality of circuit performances in response to variations in values of the process parameters;

operating the computer to perform singular value decomposition of the Jacobian matrix to provide an ordered set of singular values and a rotation vector;

selecting a subset of the ordered set of singular values, the subset including those singular values of significant magnitude;

for each of the plurality of circuit performances, deriving a worst case vector of process parameters from the selected subset of singular values and the rotation vector; and operating the computer to simulate the operation of the circuit for each of the worst case vectors of process parameters, to evaluate worst case modeled values for each of the plurality of circuit performances.

2. The method of claim 1, wherein the step of operating the computer to derive a Jacobian matrix comprises:

selecting a set of process parameter combinations according to an Orthogonal Array Design of Experiment; and operating the computer to simulate the operation of the circuit for each of the process parameter combinations.

3. The method of claim 1, wherein the step of deriving a worst case vector process parameters comprises, for each of the plurality of circuit performances:

solving for a constant value as one-half the square root of the sum of the products of each selected singular value and a corresponding element of the rotation vector; and deriving each coefficient of the worst case process vector from a ratio of the product of a corresponding singular value and a corresponding element of the rotation vector to the constant value.

4. The method of claim 3, further comprising:

before the solving step, multiplying the singular values by a scalar corresponding to a desired statistical level to which the worst case performances are to be modeled.

5. The method of claim 1, further comprising:

operating the computer to simulate the operation of the circuit for each of a plurality of randomly selected vectors of process parameters to evaluate each of the plurality of circuit performances;

selecting the worst case values of each of the plurality of circuit performances evaluated in the step of operating the computer to simulate the operation of the circuit for each of a plurality of randomly selected vectors; and comparing the results of the selected worst case values to the evaluated worst case modeled values, to verify the accuracy of the worst case modeled values.

6. The method of claim 1, wherein the electronic circuit is an analog circuit.

7. The method of claim 1, wherein the retrieved manufacturing process parameter values comprise at least one physical measurement and at least one transistor electrical parameter.

8. The method of claim 1, wherein the plurality of circuit performances comprises at least one gain measurement.

9. A computer system for modeling the performance of an electronic circuit, comprising:

a memory for storing program instructions;

a memory for storing model parameters indicative of the design of the electronic circuit to be modeled;

a memory for storing manufacturing process parameters corresponding to a manufacturing process by way of which the circuit may be fabricated;

at least one output device, for presenting the results of the modeling process to a human user; and a computer, coupled to each of the memories and to the at least one output device, and operable in response to the program instructions to perform a sequence of operations comprising:

retrieving model parameters of the circuit;

retrieving distributions of the manufacturing process parameters;

deriving a Jacobian matrix corresponding to the dependence of a plurality of circuit performances in response to variations in values of the process parameters;

performing singular value decomposition of the Jacobian matrix to provide an ordered set of singular values and a rotation vector;

selecting a subset of the ordered set of singular values, the subset including those singular values of significant magnitude;

for each of the plurality of circuit performances, deriving a worst case vector of process parameters from the selected subset of singular values and the rotation vector;

simulating the operation of the circuit for each of the worst case vectors of process parameters, to evaluate worst case modeled values for each of the plurality of circuit performances; and communicating the worst case modeled values to the at least one output device.

10. The system of claim 9, wherein the computer is programmed to perform the operation of deriving the Jacobian matrix by a sequence of operations comprising:

selecting a set of process parameter combinations according to an Orthogonal Array Design of Experiment; and simulating the operation of the circuit for each of the process parameter combinations.

11. The system of claim 9, wherein the computer is programmed to perform the operation of deriving a worst case vector of process parameters by a sequence of operations comprising, for each of the plurality of circuit performances:

solving for a constant value as one-half the square root of the sum of the products of each selected singular value and a corresponding element of the rotation vector; and deriving each coefficient of the worst case process vector from a ratio of the product of a corresponding singular value and a corresponding element of the rotation vector to the constant value.

12. The system of claim 11, further comprising:

before the solving operation, multiplying the singular values by a scalar corresponding to a desired statistical level to which the worst case performances are to be modeled.

13. The system of claim 9, wherein the sequence of operations further comprises:

simulating the operation of the circuit for each of a plurality of randomly selected vectors of process parameters to evaluate each of the plurality of circuit performances;

selecting the worst case values of each of the plurality of circuit performances evaluated in the simulating of the operation of the circuit for each of a plurality of randomly selected vectors; and comparing the results of the selected worst case values to the evaluated worst case modeled values, to verify the accuracy of the worst case modeled values.

14. A computer-readable memory having a storage medium configured so that, when read and used by a computer, the computer is directed to model the performance of an electronic circuit, said computer directed by a plurality of operations comprising:

retrieving, from a memory, model parameters of the circuit;

retrieving, from a memory, manufacturing process parameters corresponding to a manufacturing process by way of which the circuit may be fabricated;

deriving a Jacobian matrix corresponding to the dependence of a plurality of circuit performances in response to variations in values of the process parameters;

performing singular value decomposition of the Jacobian matrix to provide an ordered set of singular values and a rotation vector;

selecting a subset of the ordered set of singular values, the subset including those singular values of significant magnitude;

for each of the plurality of circuit performances, deriving a worst case vector of process parameters from the selected subset of singular values and the rotation vector; and simulating the operation of the circuit for each of the worst case vectors of process parameters, to evaluate worst case modeled values for each of the plurality of circuit performances.

15. The computer-readable memory of claim 14, wherein the operation of deriving a Jacobian matrix comprises:

selecting a set of process parameter combinations according to an Orthogonal Array Design of Experiment; and simulating the operation of the circuit for each of the process parameter combinations.

16. The computer-readable memory of claim 14, wherein the operation of deriving a worst case vector of process parameters comprises, for each of the plurality of circuit performances:

solving for a constant value as one-half the square root of the sum of the products of each selected singular value and a corresponding element of the rotation vector; and deriving each coefficient of the worst case process vector from a ratio of the product of a corresponding singular value and a corresponding element of the rotation vector to the constant value.

17. The computer-readable memory of claim 16, wherein the sequence of operations further comprises:

before the solving operation, multiplying the singular values by a scalar corresponding to a desired statistical level to which the worst case performances are to be modeled.

18. The computer-readable memory of claim 14, wherein the sequence of operations further comprises:

simulating the operation of the circuit for each of a plurality of randomly selected vectors of process parameters to evaluate each of the plurality of circuit performances;

selecting the worst case values of each of the plurality of circuit performances evaluated in the step of operating the computer to simulate the operation of the circuit for each of a plurality of randomly selected vectors; and comparing the results of the selected worst case values to the evaluated worst case modeled values, to verify the accuracy of the worst case modeled values.

* * * * *